(12) United States Patent
van Doorn

(10) Patent No.: US 6,969,265 B2
(45) Date of Patent: Nov. 29, 2005

(54) ELECTRICALLY CONNECTING INTEGRATED CIRCUITS AND TRANSDUCERS

(75) Inventor: Schelto van Doorn, San Jose, CA (US)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 09/574,647

(22) Filed: May 18, 2000

(65) Prior Publication Data

US 2002/0177333 A1 Nov. 28, 2002

(51) Int. Cl.$^7$ ............................................. H01R 12/00
(52) U.S. Cl. ........................................ 439/70; 361/283
(58) Field of Search ............................. 439/33, 84, 68, 439/638, 507, 76.1; 361/283, 787, 760, 783, 811; 360/104; 367/175; 438/27–28, 65; 257/432–433, 99; 385/89

(56) References Cited

U.S. PATENT DOCUMENTS

| | | | |
|---|---|---|---|
| 4,171,855 A | * 10/1979 | Raskin | ........................ 439/70 |
| 4,345,299 A | * 8/1982 | Ho | ............................ 361/283 |
| 4,373,778 A | 2/1983 | Adham | |
| 4,553,813 A | 11/1985 | McNaughton et al. | |
| 4,846,701 A | * 7/1989 | Hayes et al. | ................. 439/620 |
| 4,953,930 A | 9/1990 | Ramsey et al. | |
| 5,067,785 A | 11/1991 | Schirbl et al. | |
| 5,134,508 A | 7/1992 | Corda | |
| 5,199,087 A | 3/1993 | Frazier | |
| 5,408,373 A | * 4/1995 | Bajorek et al. | ............. 360/104 |
| 5,432,758 A | * 7/1995 | Sone | ........................... 367/175 |
| 5,479,288 A | 12/1995 | Ishizuka et al. | |
| 5,611,013 A | * 3/1997 | Curzio | ......................... 385/89 |
| 5,912,808 A | 6/1999 | Ikemoto | |
| 6,024,584 A | * 2/2000 | Lemke et al. | ................. 439/83 |
| 6,336,269 B1 | * 1/2002 | Eldridge et al. | .............. 29/885 |

FOREIGN PATENT DOCUMENTS

EP          0 936 485 A1     8/1999

* cited by examiner

*Primary Examiner*—Gary Paumen
*Assistant Examiner*—Edwin A. Leon
(74) *Attorney, Agent, or Firm*—Fish & Richardson P.C.

(57) ABSTRACT

Apparatus and methods of electrically connecting integrated circuits and transducers are described. In particular, a transducer includes a base mountable on a substrate (e.g., a printed circuit board), and an input/output (I/O) lead configured to contact an I/O lead of an integrated circuit mounted on the substrate. The transducer may be mounted on the substrate to contact the transducer I/O lead to the integrated circuit I/O lead. The transducer I/O lead is configured to electrically connect to the integrated circuit I/O lead independently of any electrically conductive path of the substrate. The direct electrical connection between the transducer and the integrated circuit provides a high-speed communication channel that avoids the parasitic and high-inductance limitations generally associated with conventional metallic printed circuit board traces. At the same time, the transducer is compatible with existing printed circuit board technologies and integrate circuit technologies and, therefore, may be readily integrated into existing computer systems.

19 Claims, 2 Drawing Sheets

ELECTRICALLY CONNECTING INTEGRATED CIRCUITS AND TRANSDUCERS

TECHNICAL FIELD

This invention relates to apparatus and methods of electrically connecting integrated circuits and transducers.

BACKGROUND

A transducer produces a standardized output in accordance with prescribed protocols, regardless of the medium (e.g., optical fiber or electrical conductor) through which the data is transmitted or received. A transducer typically plugs into a motherboard or circuit card in a computer (e.g., personal computer, workstation, mainframe or server) or a peripheral device (e.g., a mass storage device) and is electrically connected to other integrated circuits by conventional metallic printed circuit board traces. Jumper cables transmit data between different computers, between a computer and one or more penpheral devices, and between printed circuit boards inside the computers or peripheral devices. Data may be transferred using a variety of jumper cable technologies, including multimode optical fiber cables, single mode optical fiber cables, and copper cables (e.g., twinax and coax copper cables). Transducers transition between the transfer media of the jumper cables and the electronic data transfer protocols of the integrated circuits inside the computers and peripheral devices. For example, an opto-electronic transceiver module provides bi-directional transmission of data between the electrical interface of an integrated circuit and an optical data link (e.g., a fiber optic jumper cable). The module receives electrically encoded data signals, converts these signals into optical signals and transmits them over the optical data link. The module also receives optically encoded data signals, converts these signals into electrical signals and transmits them to the electrical interface. As used herein, the term "transducer" refers to a transducer that supports one-way communication and to a transducer (or "transceiver") that supports two-way (or bi-directional) communication.

SUMMARY

The invention features apparatus and methods of electrically connecting integrated circuits and transducers. In accordance with this inventive scheme, a transducer includes a base mountable on a substrate, and an input/output (I/O) lead configured to contact an I/O lead of an integrated circuit mounted on the substrate (e.g., a printed circuit board). The transducer may be mounted on the substrate to contact the I/O lead of the transducer to the integrated circuit I/O lead.

As used herein, the term "integrated circuit" broadly refers to an electronic component mountable on a substrate supporting one or more electrically conductive traces (or paths or channels) designed to carry electrical signals between the integrated circuit and one or more other electronic components. The term "I/O lead" broadly refers to an interface that enables a device (e.g., a transducer or an integrated circuit) to transmit data, receive data, or both.

Embodiments may include one or more of the following features.

The transducer I/O lead preferably is configured to electrically connect to the integrated circuit I/O lead independently of any electrically conductive path of the substrate. The transducer I/O lead may be configured to contact the integrated circuit I/O lead at a transducer surface substantially parallel to a mounting surface of the substrate. Alternatively, the transducer I/O lead may be configured to contact the integrated circuit I/O lead at a transducer surface adjacent to a mounting surface of the substrate. The transducer I/O lead may be configured to contact a pin I/O lead or a solder ball lead of the integrated circuit.

The transducer preferably includes a power input lead connectable to a power line of the substrate. The transducer also preferably includes a transductional device (e.g., an electronic device or an opto-electronic device).

Among the advantages of the invention are the following. The direct electrical connections between the transducers and the integrated circuits provide high-speed communication channels that avoid the parasitic and high-inductance limitations generally associated with conventional metallic printed circuit board traces. At the same time, the transducers are compatible with existing printed circuit board technologies and integrate circuit technologies. The invention, therefore, may be readily integrated into existing computer systems.

Other features and advantages of the invention will become apparent from the following description, including the drawings and the claims.

DETAILED DESCRIPTION

Figure 1:
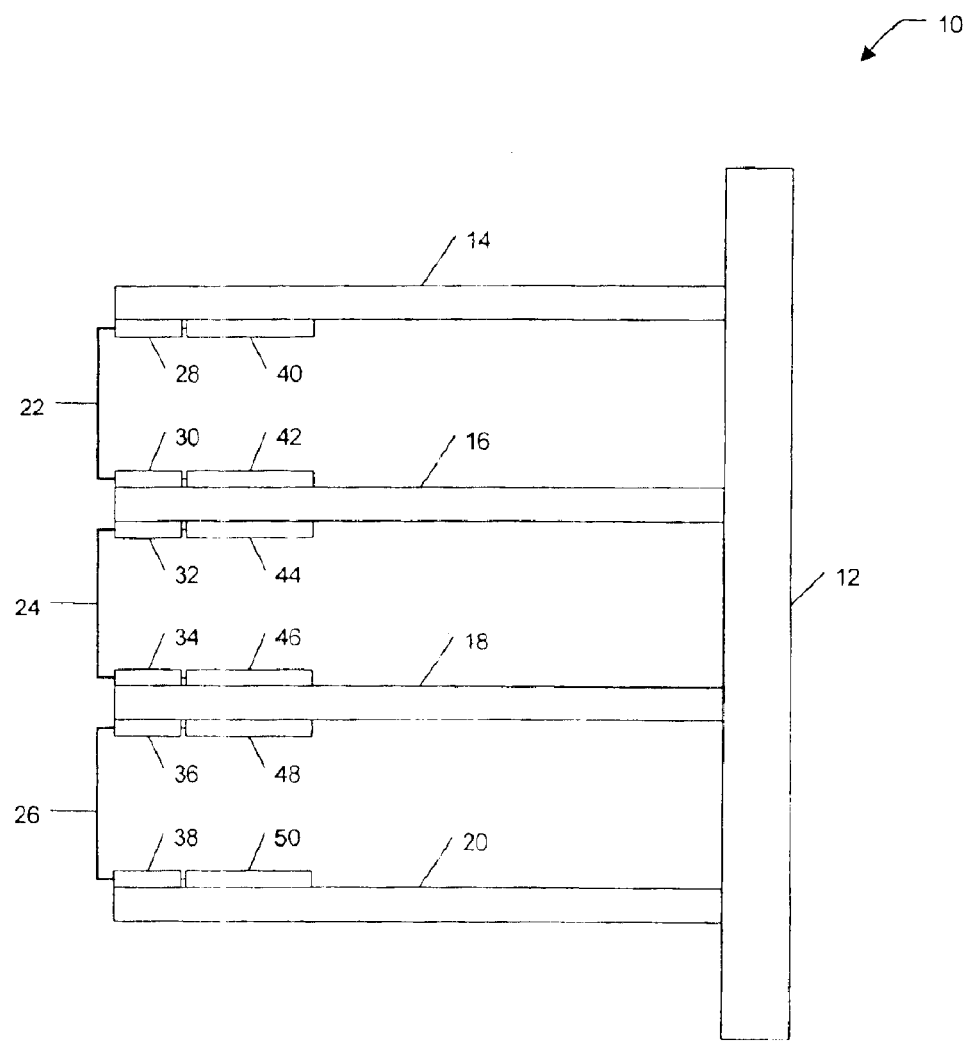
FIG. 1 is a diagrammatic side view of a computer system that includes a backplane and four printed circuit boards coupled by respective jumper cables.

Referring to FIG. 1, a computer system 10 includes a backplane 12 into which printed circuit boards 14, 16, 18 and 20 are plugged. Jumper cables 22, 24 and 26 couple printed circuit boards 14–20 through transducers 28, 30, 32, 34, 36, 38, each of which is in direct electrical contact with a respective integrated circuit 40, 42, 44, 46, 48, 50. Jumper cables 22–26 couple to transducers 28–38 through respective mating connectors. Transducers 28–38 transition between the electronic data transfer protocols of integrated circuits 40–50 and the data transfer protocols of jumper cables 22–26. The direct electrical connections between transducers 28–38 and integrated circuits 40–50 provide high-speed communication channels that avoid the parasitic and high-inductance limitations generally associated with conventional metallic printed circuit board traces. At the same time, transducers 28–38 are compatible with existing printed circuit board and integrate circuit technologies and, therefore, may be readily integrated into existing computer systems.

In an alternative embodiment, jumper cables 22–26 may extend out of backplane 12 to integrated circuits of other computer systems. Also, transducers 28–38 may be located at the edges of printed circuit boards 14–20, or they may be located in central areas of printed circuit boards 14–20.

As used herein, the term "direct electrical connection" refers to a relatively short electrical connection between the I/O leads of a transducer and an integrated circuit that does not include an electrical path of the printed circuit board. The term "printed circuit board" broadly refers to a substrate on which one or more electronic components (e.g., chips or integrated circuits) may be supported. Examples of printed circuit boards include motherboards, expansion boards, daughter-boards (or circuit cards), controller boards, network interface cards, input/output cards and adapter cards (e.g., video and audio adapter cards).

Jumper cables 22–26 may use any one of a variety of different transfer media and media connectors. For example, jumper cables 22–26 may be optical fiber cables (e.g., a single mode or a multimode optical fiber cables) or electrical (copper) cables (e.g., a twinax or a coax copper cables). The cables may be single-channel cables or multi-channel ribbon cables. The mating jumper cable and transducer connectors may conform to any one of a variety of optical and copper interface standards, including HSSDC2-type, RJ-type, SC-type, SG-type, ST-type and LC-type connectors, ribbon cable connectors, and twinax and coaxial cable connectors (e.g., SMA connectors).

The components (e.g., transducers 28–38 and integrated circuits 40–50) supported on printed circuit boards 14–20 may be housed in ball grid array (BGA) packages that include die carriers with bottom surfaces supporting a plurality of solder balls (or bumps) that connect to contacts on the surfaces of the printed circuit boards. The BGA packages may include an over molded pad array carrier or a ceramic substrate material that houses the printed circuit board components. In alternative embodiments, the printed circuit board components may be mounted to the printed circuit boards using surface mount technology (SMT) or other mounting technique, such as, bore soldering ("pin through-hole") technology or flip-chip technology. In other embodiments, transducers 28–38 and integrated circuits 40–50 may be mounted on single-sided printed circuit boards rather than two-sided printed circuit boards 14–20.

Figure 2:
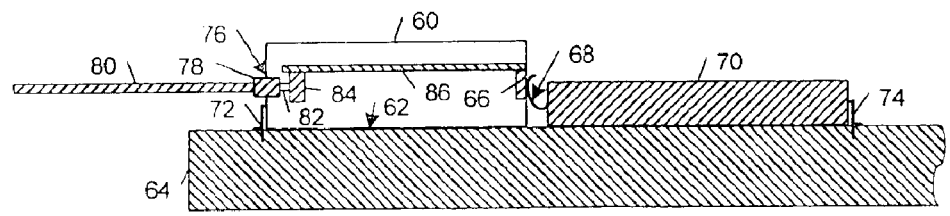
FIG. 2 is a diagrammatic cross-sectional side view of a transducer with a vertical surface I/O lead in direct electrical contact with an I/O pin lead of an integrated circuit.

Referring to FIG. 2, in one embodiment, a transducer 60 includes a base 62 which is mountable on a substrate 64 (e.g., a printed circuit board), and a vertical I/O surface lead 66 configured to make direct electrical contact with an I/O lead 68 of an integrated circuit 70 which is mounted to substrate 64. Transducer 60 and integrated circuit 70 have respective power input leads 72, 74 that connect to power lines on substrate 64. Transducer 60 and integrated circuit 70 also may include other supporting leads (e.g., sensing and other functional leads) I/O lead 66 is located on a transducer housing surface that is adjacent and substantially orthogonal to the mounting surface of substrate 64. Integrated circuit 70 may be a standard dual-inline package (DIP) type integrated circuit, and I/O lead 68 may be a standard I/O pin that is bent upwards to contact transducer I/O lead 66. Transducer 60 also includes a socket (or receptacle) 76 configured to receive a mating plug 78 of a jumper cable 80. A coupler 82 (e.g., an optical lens or an electrical conductor, depending upon the physical transfer medium of jumper cable 80) couples the data signals carried by jumper cable 80 to a transductional device 84 (e.g., an electronic or opto-electronic transceiver). Transductional device 84 transitions between the data transfer protocols of jumper cable 80 and the electronic data transfer protocols of integrated circuit 70. Transductional device 84 is mounted on a circuit card 86 that carries signals between transductional device 84 and I/O lead 66. Circuit card 86 may include passive circuitry (e.g., one or more resistors), active circuitry (e.g., one or more amplifiers), or both.

Figure 3A:
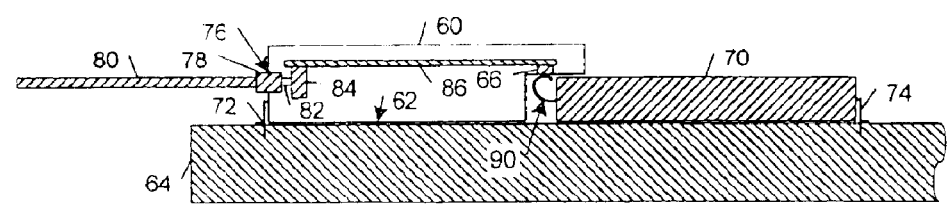
FIG. 3A is a diagrammatic cross-sectional side view of a transducer with a horizontal surface I/O lead in direct electrical contact with an I/O pin lead of an integrated circuit.
Figure 3B:
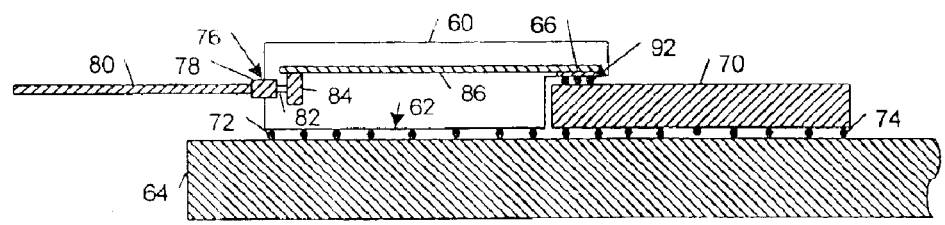
FIG. 3B is a diagrammatic cross-sectional side view of a transducer with a horizontal surface I/O lead in direct electrical contact with an I/O ball grid array lead of an integrated circuit.

As shown in FIGS. 3A and 3B, transducer I/O lead 66 may be located on a surface that is spaced apart from and substantially parallel to the mounting surface of the substrate. Transducer I/O lead 66 may directly contact a standard integrated circuit I/O pin 90 (FIG. 3A), or it may directly contact an integrated circuit ball grid array lead 92 (FIG. 3B).

Other schemes for directly connecting the transducer and integrated circuit I/O leads are contemplated. For example, the transducer I/O lead may be disposed on a surface oriented at an oblique angle with respect to the mounting surface of the substrate. In addition, other connector technologies, such as surface mount and pin-and-socket mounting technologies, may be used to directly connect the transducers to the integrated circuits.

Other embodiments are within the scope of the claims.

What is claimed is:

1. A transducer comprising:
a housing mounted on a substrate, the housing receiving a jumper cable,
an input/output (I/O) lead supported by the housing directly contacting an I/O lead of an integrated circuit, where the integrated circuit is separately mounted on the substrate and outside of the housing of the transducer, and
electronic circuitry supported by the housing transitioning between an electronic data transfer protocol of the jumper cable and an electronic data transfer protocol of the integrated circuit.

2. The transducer of claim 1, wherein the transducer I/O lead is configured to electrically connect to the integrated circuit I/O lead independently of any electrically conductive path of the substrate.

3. The transducer of claim 1, wherein the transducer I/O lead is configured to contact the integrated circuit I/O lead at a transducer surface substantially parallel to a mounting surface of the substrate.

4. The transducer of claim 1, wherein the transducer I/O lead is configured to contact a pin I/O lead of the integrated circuit.

5. The transducer of claim 1, wherein the transducer I/O lead is configured to contact a solder ball lead of the integrated circuit.

6. The transducer of claim 1, wherein the transducer I/O lead is configured to contact the integrated circuit I/O lead at a transducer surface adjacent to a mounting surface of the substrate.

7. The transducer of claim 1, further comprising a power input lead connectable to a power line of the substrate.

8. The transducer of claim 1, further comprising a transductional device.

9. The transducer of claim 1, wherein the transductional device is an opto-electronic device.

10. The transducer of claim 1, wherein the transductional device is an electronic device.

11. A transducer comprising:
a housing mounted on a substrate, the housing receiving a jumper cable;
an input/output (I/O) lead supported by the housing and directly contacting an I/O lead of an integrated circuit, where the integrated circuit is separately mounted on the substrate and outside of the housing of the transducer; and electronic circuitry supported by the housing transitioning between an electronic data transfer protocol of the jumper cable and an electronic data transfer protocol of the integrated circuit, the electronic circuitry including:
- a coupler coupling data signals carried by a jumper cable received by the housing to a transductional device;
- a transductional device transitioning between an electronic data transfer protocol of the jumper cable and an electronic data transfer protocol of the integrated circuit; and
- a circuit card carrying signals between the transductional device and the I/O lead supported by the housing.

12. The transducer of claim 11, wherein the transducer I/O lead is configured to electrically connect to the integrated circuit I/O lead independently of any electrically conductive path of the substrate.

13. The transducer of claim 11, wherein the transducer I/O lead is configured to contact the integrated circuit I/O lead at a transducer surface substantially parallel to a mounting surface of the substrate.

14. The transducer of claim 11, wherein the transducer I/O lead is configured to contact a pin I/O lead of the integrated circuit.

15. The transducer of claim 11, wherein the transducer I/O lead is configured to contact a solder ball lead of the integrated circuit.

16. The transducer of claim 11, wherein the transducer I/O lead is configured to contact the integrated circuit I/O lead at a transducer surface adjacent to a mounting surface of the substrate.

17. The transducer of claim 11, further comprising a power input lead connectable to a power line of the substrate.

18. The transducer of claim 11, wherein the transductional device is an opto-electronic device.

19. The transducer of claim 11, wherein the transductional device is an electronic device.

* * * * *